US 008661900B2

(12) United States Patent
Merassi et al.

(10) Patent No.: US 8,661,900 B2
(45) Date of Patent: Mar. 4, 2014

(54) Z-AXIS MICROELECTROMECHANICAL DEVICE WITH IMPROVED STOPPER STRUCTURE

(75) Inventors: Angelo Antonio Merassi, Vigevano (IT); Sarah Zerbini, Cornaredo (IT); Barbara Simoni, Leghorn (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 1287 days.

(21) Appl. No.: 12/014,563

(22) Filed: Jan. 15, 2008

(65) Prior Publication Data
US 2008/0173959 A1   Jul. 24, 2008

(30) Foreign Application Priority Data
Jan. 19, 2007   (IT) ............... TO2007A0033

(51) Int. Cl.
*G01P 15/08* (2006.01)
(52) U.S. Cl.
USPC ...................... 73/514.24; 257/415
(58) Field of Classification Search
USPC ............ 257/415, 417, 418, 419, 420; 73/514.01, 514.16, 514.18, 514.21, 73/514.22, 514.23, 514.24; 514/29, 514/514.36, 514.37
See application file for complete search history.

(56) References Cited

U.S. PATENT DOCUMENTS

| | | | |
|---|---|---|---|
| 4,930,043 A | 5/1990 | Wiegand | |
| 5,181,156 A | 1/1993 | Gutteridge et al. | |
| 5,488,864 A | 2/1996 | Stephan | |
| 5,581,035 A | 12/1996 | Greiff | |
| 5,905,203 A * | 5/1999 | Flach et al. | 73/514.32 |
| 6,230,564 B1 * | 5/2001 | Matsunaga et al. | 73/514.01 |
| 6,935,175 B2 | 8/2005 | Eskridge et al. | |
| 7,406,869 B2 * | 8/2008 | Jouanet et al. | 73/510 |
| 2003/0057447 A1 * | 3/2003 | Saitoh et al. | 257/200 |
| 2004/0160232 A1 | 8/2004 | Yue et al. | |
| 2005/0217378 A1 * | 10/2005 | Ishikawa et al. | 73/514.01 |
| 2006/0169043 A1 * | 8/2006 | McNeil | 73/514.01 |

FOREIGN PATENT DOCUMENTS

| | | |
|---|---|---|
| EP | 0773443 A1 | 5/1997 |
| GB | 2251693 A | 7/1992 |
| JP | H11326791 A | 11/1999 |
| JP | 2000019198 A | 1/2000 |
| JP | 2001066320 A | 3/2001 |
| JP | 2005321663 A | 11/2005 |
| WO | 2008012846 A1 | 1/2008 |

\* cited by examiner

*Primary Examiner* — Vongsavanh Sengdara
(74) *Attorney, Agent, or Firm* — Seed IP Law Group PLLC

(57) ABSTRACT

In a microelectromechanical device, a mobile mass is suspended above a substrate via elastic suspension elements and is rotatable about said elastic suspension elements, a cover structure is set above the mobile mass and has an internal surface facing the mobile mass, and a stopper structure is arranged at the internal surface of the cover structure and extends towards the mobile mass in order to stop a movement of the mobile mass away from the substrate along an axis (z) transverse to the substrate. The stopper structure is arranged with respect to the mobile mass so as to reduce an effect of reciprocal electrostatic interaction, in particular so as to minimize a resultant twisting moment of the mobile mass about the elastic suspension elements.

26 Claims, 4 Drawing Sheets

Z-AXIS MICROELECTROMECHANICAL DEVICE WITH IMPROVED STOPPER STRUCTURE

BACKGROUND

1. Technical Field

The present disclosure relates to a z-axis microelectromechanical device, having an improved stopper structure.

2. Description of the Related Art

Microelectromechanical devices (of a MEMS type), for example inertial sensors, accelerometers, gyroscopes, etc., base their operation on the presence of suspended structures made of semiconductor material, which are fixed to a substrate at one or more anchorage points via elastic suspension elements, and are mobile along one or more axes according to the configuration of the suspension elements. The suspended structures form one or more mobile masses that undergo displacements with respect to the substrate in the presence of external stimuli.

In particular, known z-axis MEMS devices include a mobile mass that is able to rotate out of a plane xy of main extension thereof about a fulcrum axis defined by corresponding suspension elements, originating a resultant movement along an axis z perpendicular to the plane xy. The mobile mass is unbalanced, in so far as it includes a first portion and a second portion, set on opposite sides with respect to the suspension elements and having a different twisting moment about the fulcrum axis. A stress (for example, an acceleration) directed in a direction perpendicular to the plane of the mobile mass causes a rotation (or tilting) thereof about the fulcrum axis, the quantity and direction of rotation correlated to the stress amount.

In a known manner, due to an external event, for example an impact or shock, the mobile masses of microelectromechanical devices can undergo undesirable displacements of considerable amount out of their plane xy of main extension, along the axis z, orthogonal to the plane xy. This displacement can, in the worst case, cause breaking of the suspension elements associated with the mobile masses or cause damage to the same mobile masses or other elements of the microelectromechanical device.

For this reason, stopper structures (generally known as "stoppers") are provided in MEMS devices made with planar manufacturing processes; stoppers are designed to limit movements of the mobile masses and of the corresponding suspension elements and thus prevent damage.

Stopper structures are usually made as downward projections of a package or cap covers and englobes or encapsulates the microelectromechanical device. In particular, projections directed towards the mobile mass extend from an internal face of the package facing a top face of the mobile mass. These projecting portions of the package reduce the range of movement along the axis z for the mobile mass; in particular, the mobile mass stops, abutting against the projections, prior to onset of damage.

However, at its projecting portions, the package is close to the mobile mass, so that, if the mobile mass and package are kept at different potentials, an electrostatic interaction of a non-negligible amount is generated. This interaction can cause undesirable displacements of the mobile mass and in general malfunctioning of the microelectromechanical device. In detail, in the case of a sensor device, a displacement of the zero level (for example, an accelerometer 0 g level) in the presence of external electrical fields or a non-ratiometricity of the output signal can occur. This is rather frequent in so far as the package and consequently the projections coupled thereto are generally kept either at a floating potential, hence not at the same potential as the mobile mass or at a fixed potential, whilst the mobile mass is supplied with different potentials according to an operating condition of the device.

Other types of stopper structures have been proposed to overcome these drawbacks. For example, in the patent application No. WO-PCTIT0600576, filed on Jul. 26, 2006 in the name of the present applicant, a stopper structure is disclosed that includes a stopper element fixedly coupled to a mobile mass, and configured to abut against a stopper mass, facing the mobile mass in the plane xy, in response to a spurious movement along the axis z, in this way stopping the spurious movement. In detail, the stopper element is arranged on the opposite side of the stopper mass with respect to a direction of the spurious movement, and extends out of the space occupied by the mobile mass and into the space occupied by the stopper mass along the axis z.

BRIEF SUMMARY

The present disclosure provides a microelectromechanical device having a stopper structure that constitutes an improvement over known designs and enables the aforesaid problems and disadvantage to be overcome, in particular reducing the risks of breaking due to shock and at the same time not significantly affecting proper operation of the device.

In accordance with one embodiment of the disclosure a microelectromechanical device is provided that includes a mobile mass, suspended above a substrate via elastic suspension elements and rotatable about said elastic suspension elements; a cover structure arranged above said mobile mass and having an internal surface facing said mobile mass; and a stopper structure arranged at said internal surface of said cover structure and extending towards said mobile mass and designed to stop a movement of said mobile mass away from said substrate along an axis (z) transverse to said substrate, said stopper structure arranged with respect to said mobile mass to reduce an effect of a reciprocal interaction.

In accordance with another aspect of the foregoing embodiment, the stopper structure is arranged to reduce a resultant twisting moment of said mobile mass about said elastic suspension elements due to said interaction, said interaction being of an electrostatic type and resulting from a different electrical potential of the mobile mass and the stopper structure.

In accordance with another aspect of the foregoing embodiment, the stopper structure is arranged so as to minimize, and more particularly, in another embodiment to make substantially zero, the resulting twisting moment. Ideally, the elastic suspension element are aligned to define a rotation axis of the mobile mass, and the stopper structure is set in the proximity of the rotational axis.

In accordance with another aspect of the foregoing embodiment, the mobile mass internally has a window in which the elastic suspension elements are set, and the stopper structure includes a first stopper element and a second stopper element set on opposite sides of the window and overlapping opposite sides of the mobile mass along the rotational axis.

In accordance with another aspect of the present disclosure, an electronic apparatus is provided that includes a microelectromechanical device according to the foregoing, and in particular the device including one of an accelerometer, a gyroscope, and a microphone.

In accordance with another aspect of the present disclosure, a process for manufacturing a microelectromechanical device is provided. The process includes the steps of forming a mobile mass, suspended above a substrate via elastic suspension elements and rotatable about said elastic suspension elements; coupling, above said mobile mass, a cover structure having an internal surface facing said mobile mass; and forming a stopper structure at said internal surface of said cover structure and extending towards said mobile mass and configured to stop a movement of said mobile mass away from said substrate along an axis (z) transverse to said substrate, forming a stopper structure comprises arranging said stopper structure with respect to said mobile mass so as to reduce an effect of a reciprocal interaction.

In accordance with another embodiment of the present disclosure, a device is provided, the device includes a mobile mass suspended above a substrate on an elastic suspension system to rotate about the elastic suspension system, the mobile mass having a larger portion on one side of the elastic suspension system and a smaller portion on an opposite side of the elastic suspension system to have a twisting moment about a rotational axis of the elastic suspension system; and a cover structure arranged above the mobile mass and having an internal surface facing the mobile mass, the cover structure comprising a stopper structure extending toward the mobile mass and separated therefrom by a distance that stops a movement of the mobile mass away from the substrate along an axis substantially perpendicular to the substrate, the stopper structure configured to have a greater area of overlap with the smaller portion of the mobile mass than with the larger portion of the mobile mass, resulting in an electrostatic force between the stopper structure and the mobile mass to counteract the twisting moment of the mobile mass.

In accordance with another aspect of the foregoing embodiment, a single stopper element is provided.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein:

FIG. 1b shows a schematic cross section of the device of FIG. 1, taken along the line of section I-I of FIG. 1a;

FIGS. 2b, 3b, 4b, 5b and 6b show schematic cross sections of the devices of FIGS. 2a-6a, taken along the lines of section II-II-VI-VI of FIGS. 2a-6a;

DETAILED DESCRIPTION

As will be clarified in what follows, an aspect of the present disclosure envisages forming the stopper structures for the mobile mass as one or more downward projections of a corresponding package, and also arranging the projections with respect to the mobile mass in such a way as to minimize the effects of a resultant reciprocal electrostatic interaction.

Figure 1A:
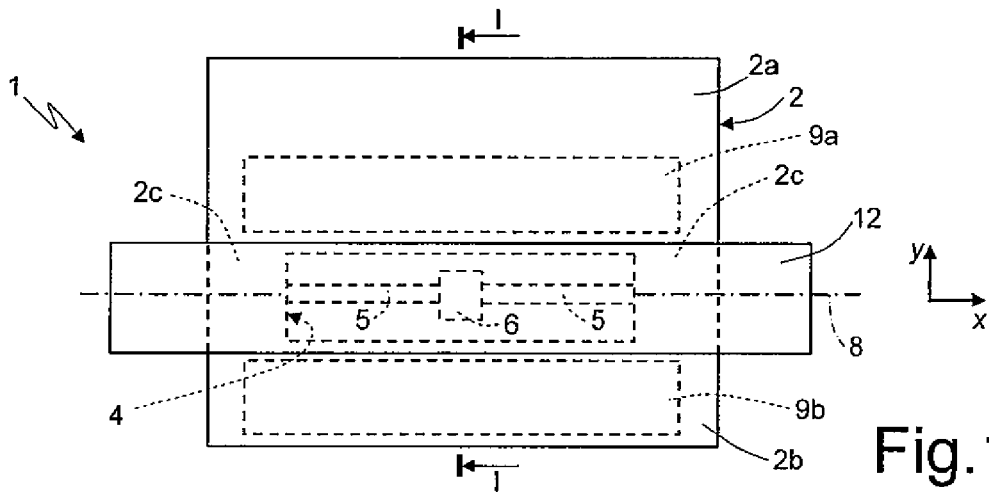
FIG. 1a shows a schematic plan view of a microelectromechanical device and a corresponding stopper structure, according to an embodiment of the present invention.
Figure 1B:
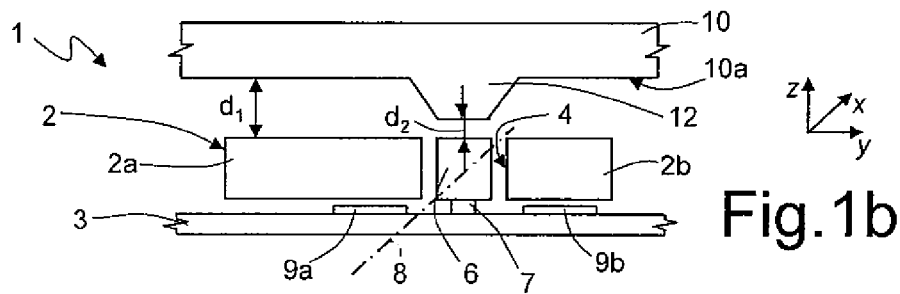

In detail, and with reference to FIGS. 1a-1b, a microelectromechanical device 1, made according to a first embodiment of the present disclosure, includes a mobile mass 2 suspended above a substrate 3 made of semiconductor material, in particular silicon; the mobile mass 2 is made of conductive material, for example polysilicon. The mobile mass 2 extends mainly in a plane xy, and a window 4 is provided within the mobile mass 2 and traverses it throughout its thickness; for example, the window 4 has a substantially rectangular shape, with a main extension (length) in a first direction x of the plane xy, and a smaller extension (width) in a second direction y of the plane xy, orthogonal to the first direction x. The mobile mass 2 is connected via suspension elements 5, having torsional and elasticity characteristics, to an anchorage 6 fixed to and rigid with the substrate 3. The anchorage 6 is connected to the substrate 3 via an adhesion region 7, set between the substrate and the same anchorage. Both the suspension elements 5 and the anchorage 6 are arranged within the window 4, and the suspension elements 5 have an elongated shape and extend on opposite sides of the anchorage 6 towards the mobile mass 2, aligned in the first direction x, defining an inclination (or rotation) axis 8 for the mobile mass. The mobile mass 2, the suspension elements 5, and the anchorage 6 are obtained using known techniques starting from a same conductive structural layer, for example polysilicon.

The mobile mass 2 has a configuration that is unbalanced and asymmetrical with respect to the inclination axis 8 in so far as its center of mass does not lie on the inclination axis. Furthermore, the mobile mass 2 is divided by the window 4 into a larger portion 2a, a smaller portion 2b, and connecting portions 2c that connect the smaller and larger portions on opposite sides of the window 4 along the first direction x. In particular, the larger portion 2a has a greater width and is set on the opposite side of the suspension elements 5 with respect to the smaller portion 2b in the second direction y. Respective electrodes 9a, 9b (illustrated in FIGS. 1a-1b only) are provided underneath the larger and smaller portion 2a, 2b. The electrodes 9a, 9b are set above the substrate 3 and are made, e.g., of polysilicon, and, when appropriately biased, form respective detection capacitors with the overlying portion of the mobile mass.

In use, given the unbalancing of the mobile mass 2 with respect to the inclination axis 8, a stress (for example, an acceleration) along the axis z causes rotation thereof with respect to the anchorage 6 and to the substrate 3. In fact, the stress causes a resultant twisting moment of the mobile mass 2 about the inclination axis 8, due to the different moment generated by the larger portion 2a and by the smaller portion 2b (the moment corresponding in a known way to the product between the force and the arm of the force with respect to the axis of rotation). Consequently, one between the larger portion 2a and the smaller portion 2b approaches, whilst the other moves away from, the respective electrode 9a, 9b so as to originate a capacitive unbalancing of the detection capacitors. Based on the unbalancing, an appropriate detection electronics (herein not illustrated), conveniently integrated with known processes within the substrate 3, can determine the amount of stress acting along the axis z.

As shown in FIG. 1b, the microelectromechanical device 1 further comprises a cap (or package) 10 (not illustrated in FIG. 1a for reasons of clarity of illustration), which covers and overlies the substrate 3 and the mobile mass 2, and has an internal face 10a, generally separated from a facing surface of the mobile mass 2 by a first distance of separation $d_1$. The first distance of separation $d_1$ has a high value, equal, for example, to 160 µm, such as to render substantially negligible an electrostatic interaction with the mobile mass, in the case where the mobile mass 2 and the cap 10 have different potentials.

The cap 10, made of semiconductor material or other material (for example, glass), is joined in a known way to the substrate 3, for example via bonding techniques, so as to encapsulate the device.

The microelectromechanical device 1 further includes a stopper structure provided with at least a first stopper element 12, designed to limit an undesirable movement of the mobile mass 2 and of the associated suspension elements 5 along the axis z transverse to the substrate, limiting movement perpendicular to the substrate 3, thus reducing the risk of breaking, e.g., in the event of shock. The first stopper element 12 is formed as a downward projecting portion of the cap 10, and extends from the internal face 10a towards the mobile mass 2. For example, the first stopper element 12 and the cap 10 are made starting from a single wafer of material, the first stopper element 12 being defined by chemical etching, for example via a wet-TMAH etch. The first stopper element 12 has a considerable thickness, for example equal to 150 µm, so as to be separated from the mobile mass 2 by a second distance of separation $d_2$ having a small value, equal for example to 10 µm. The first stopper element 12 consequently generates a significant electrostatic interaction with the mobile mass 2, in the case where it is kept at a potential different from that of the mobile mass.

According to an aspect of the present disclosure, the stopper structure is, however, arranged with respect to the mobile mass 2, in such a manner as to minimize a twisting moment of the same mobile mass about the inclination axis 8, due to the electrostatic interaction.

In detail, in the first embodiment described, the first stopper element 12 is set in the proximity of the inclination axis 8; in particular, it is arranged at, and centered with respect to, the inclination axis 8. The first stopper element 12 has an elongated shape, covers the window 4 (having a greater extension in the second direction y) entirely, and extends in the first direction x, parallel to the inclination axis 8, throughout the mobile mass 2 and beyond, consequently crossing the connecting portions 2c. A possible electrostatic interaction force between the mobile mass 2 and the stopper element 12 has a small arm with respect to the inclination axis 8, and in any case generates substantially equal and opposite twisting moments on portions of the mobile mass set on opposite sides of the inclination axis 8, so that a resultant twisting moment acting on the mobile mass 2 is substantially zero (in the assumption that the effects of the package 10 are neglected, given the distance from the mobile mass).

Figure 2A:
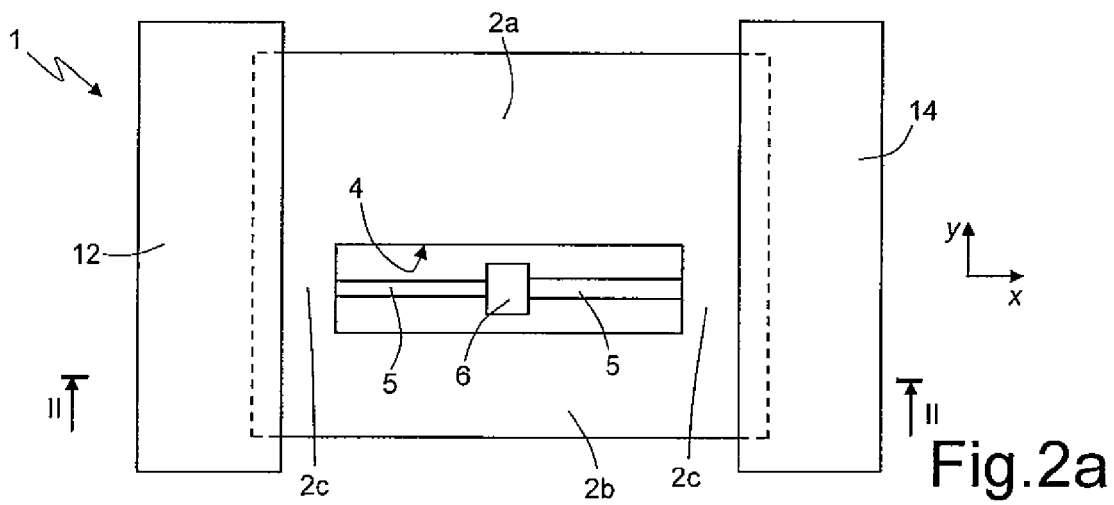
FIGS. 2a, 3a, 4a, 5a and 6a show respective schematic plan views similar to that of FIGS. 1a-1b, in different embodiments of the microelectromechanical device.
Figure 2B:
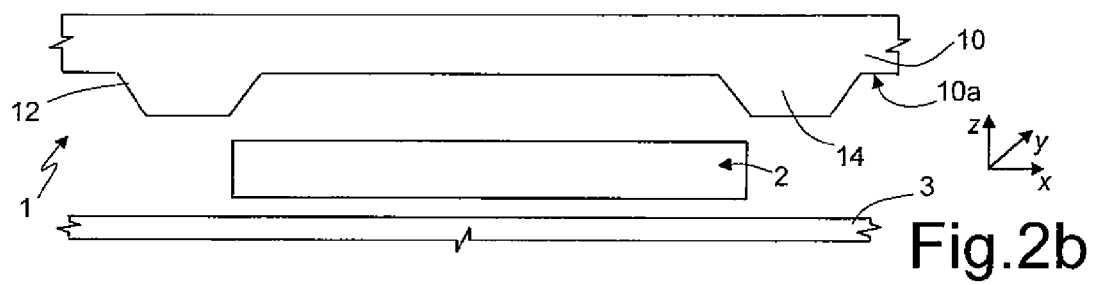

As illustrated in FIGS. 2a-2b, in a second embodiment of the present disclosure, the stopper structure includes a first stopper element 12 and a second stopper element 14, of substantially equal shape and size, extending in the second direction y throughout the width of the mobile mass 2, on opposite sides of the window 4, and overlapping opposite sides of the mobile mass 2 in the first direction x. In particular, the first and second stopper elements 12, 14, again formed as downward projecting portions of the cap 10 (in a way altogether similar to what has been described previously), have a small area of overlap with the underlying mobile mass 2, at the respective opposite sides, and extend in width mainly on the outside of the mobile mass. In this embodiment, the electrostatic interaction between the mobile mass 2 and the cap 10 (and the first and second stopper elements 12, 14), due to their potential difference, is minimal, given the small area of overlap. However, a slight resultant twisting moment on the mobile mass 2 is generated: in fact, the larger portion 2a of the mobile mass 2 generates a greater twisting moment about the inclination axis 8 as compared to the smaller portion 2b, due to its greater amount of overlap with the stopper elements in the second direction y as compared to the smaller portion 2b (respective amounts of overlap in the first direction x being, instead, the same).

Figure 3A:
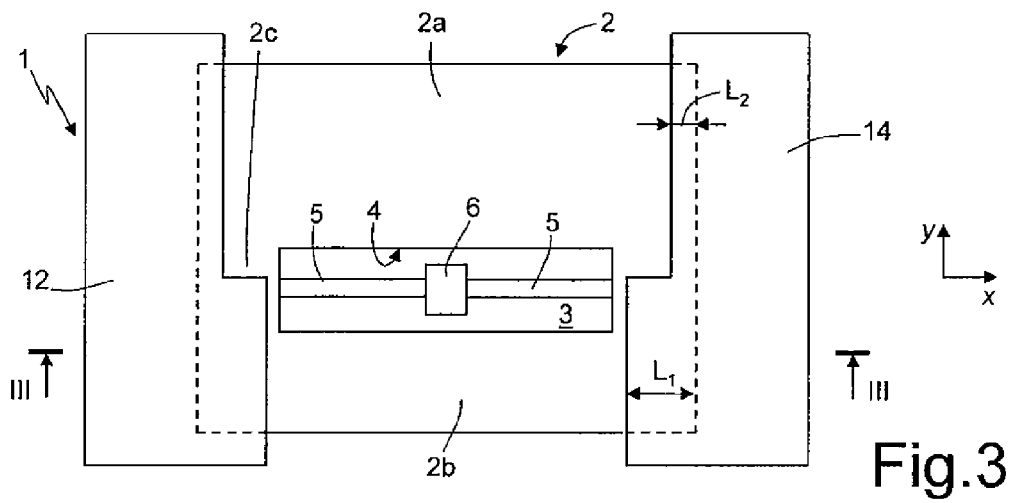
Figure 3B:
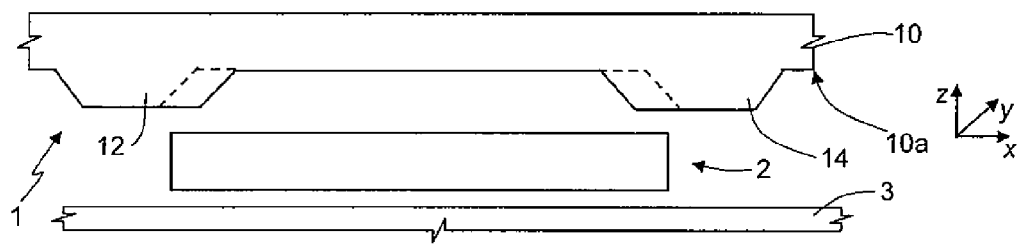

To overcome the above condition, and to obtain a substantially zero resultant twisting moment of the mobile mass 2, a third embodiment of the invention (FIGS. 3a-3b) envisages that the first and second stopper elements 12, 14, arranged in a way similar to what has been described previously, have a conformation such as to balance the twisting moments generated on the larger and smaller portions 2a, 2b of the mobile mass 2. In particular, the stopper elements 12, 14 are in this case shaped so as to have a greater area of overlap with the smaller portion 2b as compared to the area of overlap with the larger portion 2a (in this way balancing the effect of the greater arm of the electrostatic interaction force with the larger portion 2a). In detail, the first and second stopper elements 12, 14 have a first width $L_1$ (in the first direction x) in the area of overlap with the aforesaid smaller portion 2b, and a second width $L_2$, smaller than the first width $L_1$, in the area of overlap with the aforesaid larger portion 2a. The first and second widths $L_1$, $L_2$ are sized so as to balance the twisting moments with respect to the inclination axis 8 of the larger and smaller portions 2a, 2b of the mobile mass 2 so as to generate a zero resultant twisting moment on the mobile mass (once again neglecting the contribution of electrostatic interaction of the package 10).

Figure 4A:
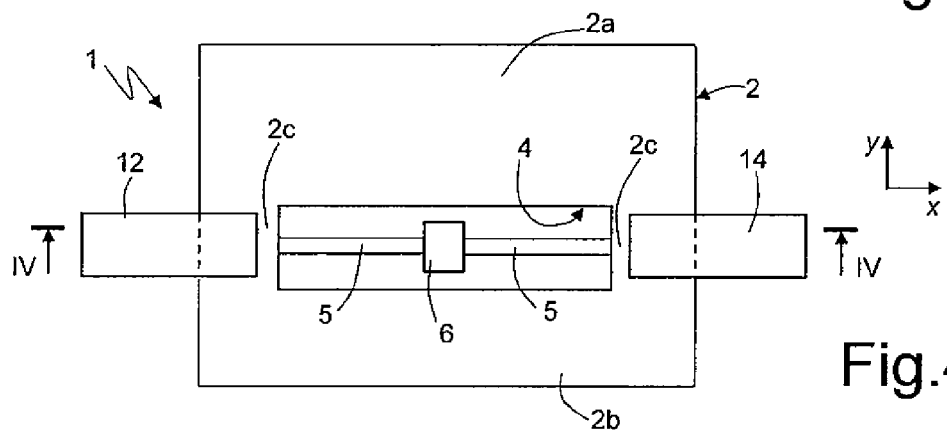
Figure 4B:
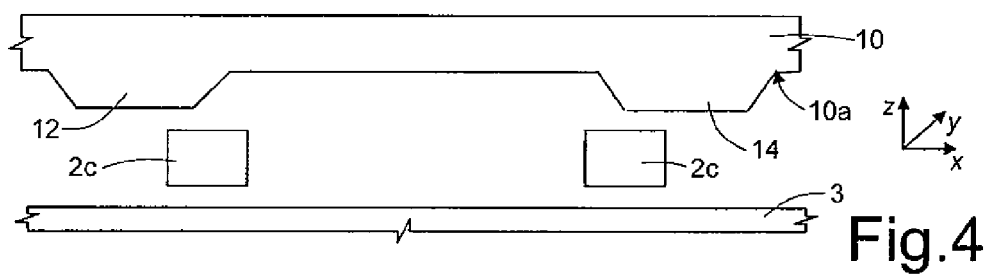

In a fourth embodiment of the disclosure, illustrated in FIGS. 4a-4b, the first and second stopper elements 12, 14 are again arranged on opposite sides of the window 4 in the first direction x, and in particular in a position corresponding, and centered with respect to the inclination axis 8. The stopper elements 12, 14 thus overlap just the connecting portions 2c of the mobile mass 2, and extend in length principally outside of the mobile mass. As described for the first embodiment, the arrangement of the stopper elements at the inclination axis 8 enables the resultant twisting moment on the mobile mass 2 to be minimized.

Furthermore, the configuration of the stopper elements described in FIGS. 4a, 4b can prove advantageous with respect to the one described in FIGS. 1a, 1b (which envisages a single continuous stopper element set on the entire length of the mobile mass at the inclination axis 8), being more insensitive to possible misalignments arising in the manufacturing stage between the substrate 3 and the cap 10 (for example, during a bonding step). In particular, misalignments arising in the second direction y can cause an undesirable twisting moment of the mobile mass 2; their negative effect is reduced by reduction of the area of overlap (and hence of electrostatic interaction) between mobile mass and stopper elements (as illustrated in FIGS. 4a, 4b).

Figure 5A:
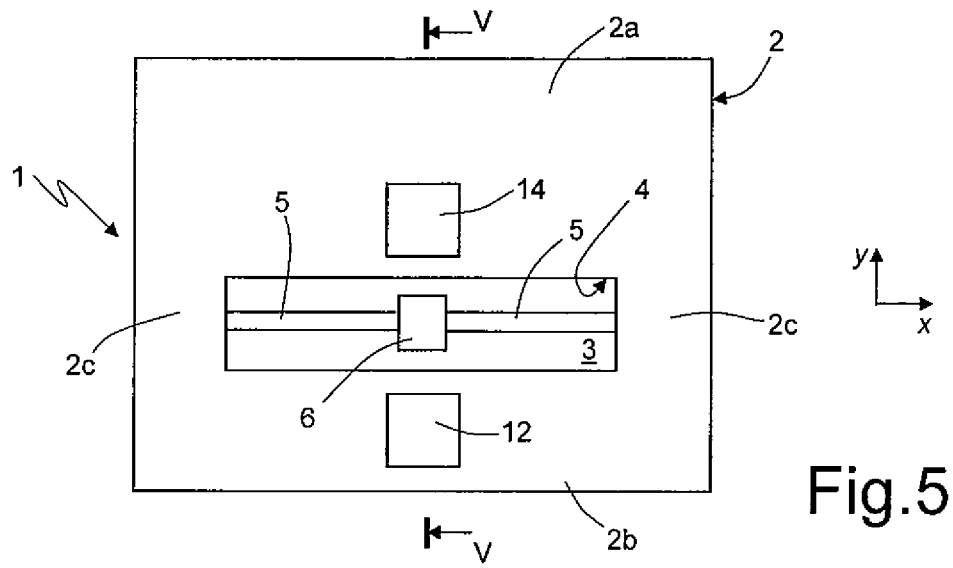
Figure 5B:
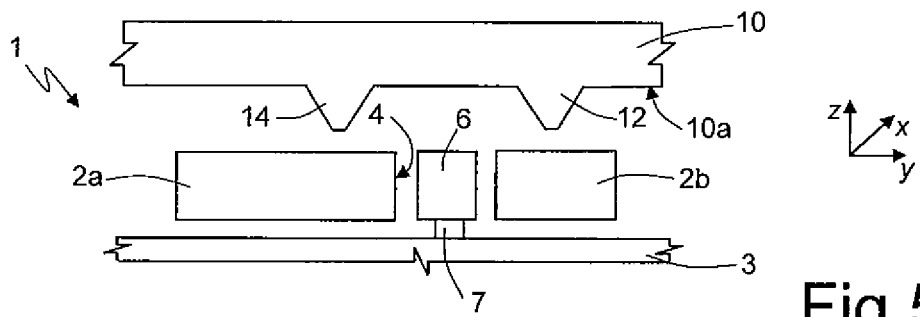

With reference now to FIGS. 5a-5b, a fifth embodiment of the disclosure envisages that the first and second stopper elements 12, 14 are set on opposite sides of the window 4 and inclination axis 8, equidistant from the inclination axis, and have a substantially equal shape and size (in this case, much smaller than the size of the mobile mass 2). Furthermore, in the example represented, the stopper elements are aligned in the second direction y in a central position with respect to the mobile mass 2 (in particular, aligned to the anchorage 6), and are arranged in the proximity of the window 4. Also in this embodiment, the resultant twisting moment on the mobile mass 2 is substantially zero, since there is a substantially exact balance of the moments of the larger and smaller portions 2a, 2b (the stopper elements have in fact the same area of overlap with the mobile mass and are located at the same distance from the inclination axis).

Figure 6A:
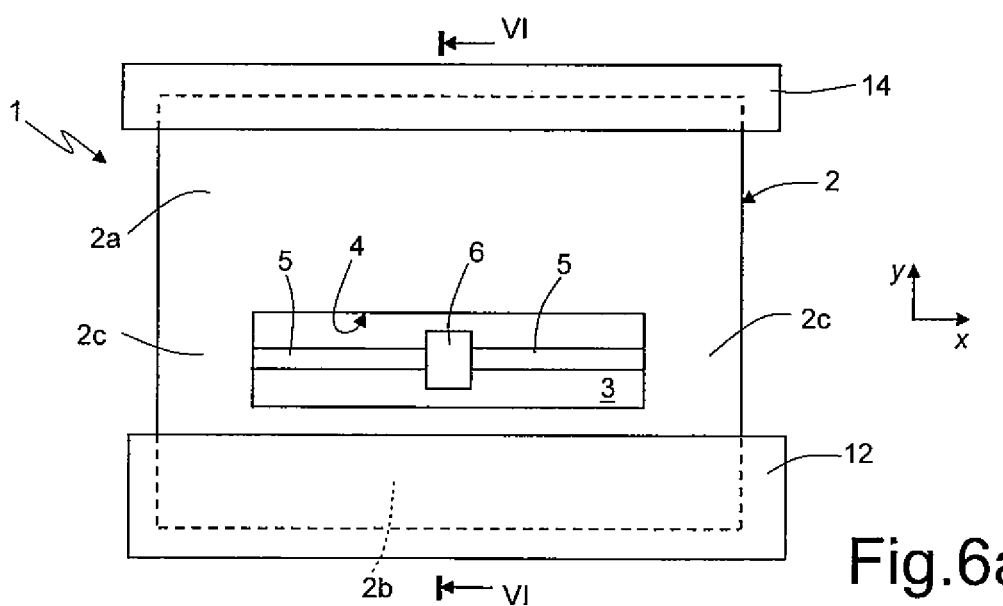
Figure 6B:
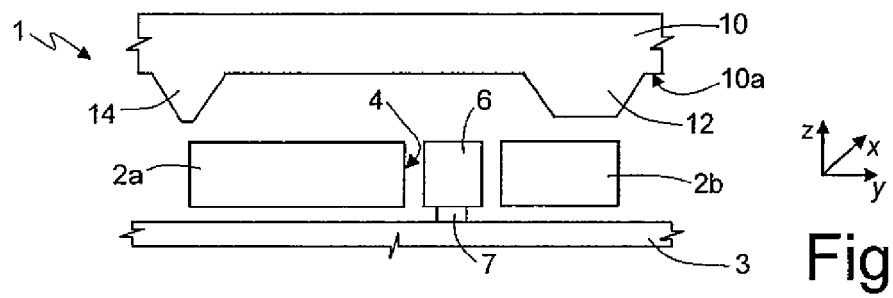

In a sixth embodiment of the present disclosure (FIGS. 6a-6b), the first and second stopper elements 12, 14 are again set on opposite sides of the window 4, and extend in the first direction x throughout the length of the mobile mass 2, overlapping sides of the mobile mass 2 opposite to the inclination axis 8. To balance the twisting moments of the larger and smaller portions 2a, 2b of the mobile mass 2, and in particular the different arm of a corresponding force of interaction, the first interaction element 12, placed above the smaller portion 2b, has an area of overlap with the underlying smaller portion greater than the area of overlap of the second stopper element 14 with the underlying larger portion 2a. In particular, the first stopper element 12 has an amount of overlap (in the second direction y) greater than a corresponding amount of overlap of the second stopper element 14 (respective amounts of overlap in the first direction x being, instead, the same).

According to a further aspect of the present disclosure (see FIG. 7), the microelectromechanical device 1 includes: a first and a second mobile mass 2, 2', which are the same as one another and are aligned in the second direction y, the second mobile mass 2' being turned upside down with respect to the first mobile mass 2 (corresponding smaller portions 2b, 2b' being consequently set at a close distance and facing each other in the second direction y); and a first and a second stopper structure 12, 12', which are the same as one another and are associated, respectively, to the first and second mobile mass. The mobile masses and the corresponding stopper structures are made in a way altogether equivalent to what has been described for the first embodiment (FIGS. 1a-1b), and, in particular, the mobile masses are suspended above, and anchored to, the same substrate 3. Consequently, each stopper structure is set with respect to the corresponding mobile mass in such a manner as to minimize the twisting moment of the same mobile mass due to reciprocal electrostatic interaction.

Figure 7:
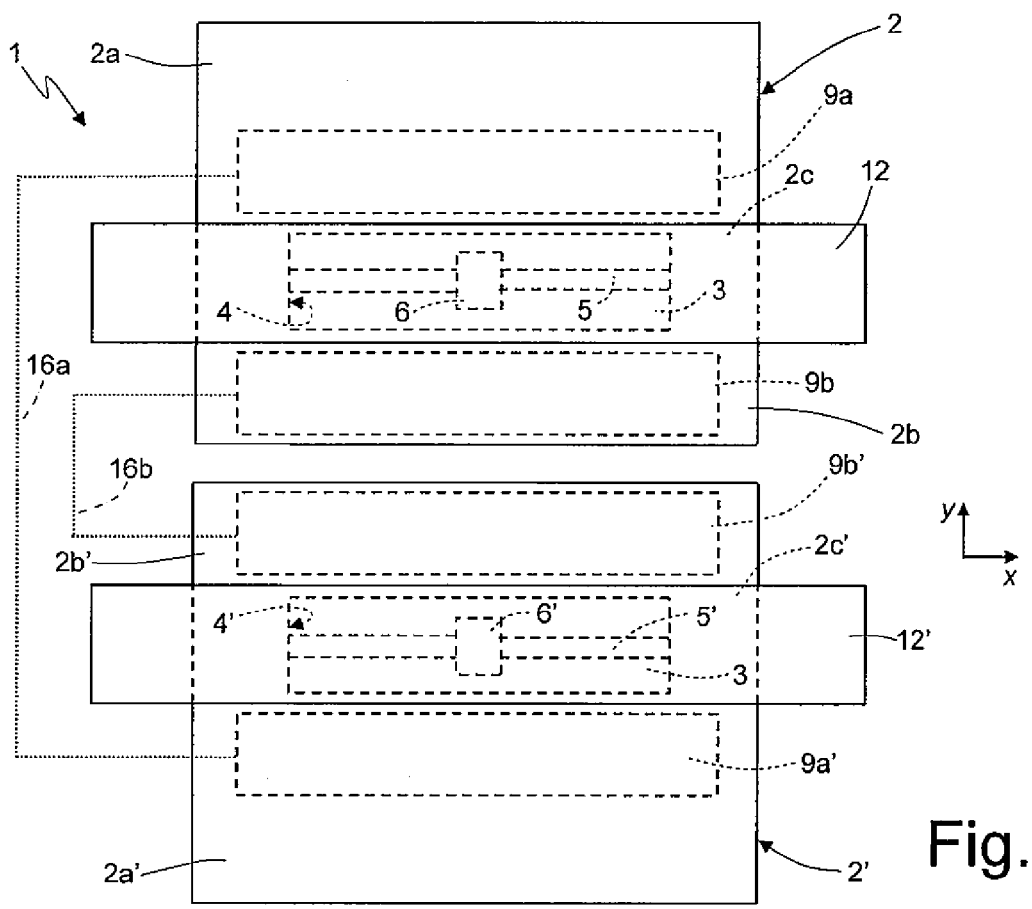
FIG. 7 shows a schematic plan view of a microelectromechanical device according to a further aspect of the present invention.

Furthermore, the electrodes 9a, 9a' facing the respective larger portions 2a, 2a' of the first and second mobile mass 2, 2' are connected electrically together via connections 16a, as likewise the electrodes 9b, 9b' facing the respective smaller portions 2b, 2b' of the same mobile masses are connected electrically together via respective connections 16b (as illustrated schematically in FIG. 7). Furthermore, the first and second mobile mass 2, 2' are connected electrically together. In this way, the detection capacitors formed by the larger and smaller portions of the mobile masses with the respective electrodes are connected in parallel, and the corresponding capacitive unbalancings add up.

The configuration described is particularly advantageous in so far as it has a double sensitivity in detection of stresses acting along the axis z (given that the capacitive contributions of the detection capacitors formed by the two mobile masses are summed), and is also practically insensitive to misalignments between the cap 10 and the substrate 3, in particular those in the second direction y. In fact, a misalignment of this sort causes, for example, a greater overlap of the first stopper element 12 associated to the first mobile mass 2 with the smaller portion 2b of the same mobile mass, and a corresponding twisting moment about the inclination axis 8 causing unbalancing of the corresponding detection capacitors. At the same time, however, this misalignment causes a greater overlap of the first stopper element 12' associated to the second mobile mass 2' this time with the larger portion 2a' of the same mobile mass, and a corresponding twisting moment about the inclination axis 8, causing an opposite unbalancing of the corresponding detection capacitors. Basically, rotation of the mobile masses due to misalignment generates equal and opposite capacitive unbalancings of the detection capacitors, so that the resultant electrical quantity (given by the sum of the capacitive unbalancings) supplied to a corresponding interface electronics does not undergo an appreciable variation. It follows that operation of the device is not jeopardized by these misalignments.

This configuration also enables rejection of effects of angular accelerations acting on the microelectromechanical device 1 about the inclination axis 8, which otherwise could produce false detections of stresses along the axis z.

The advantages of the microelectromechanical device and of the corresponding stopper structures of the present design are clear from the foregoing description.

In any case, it is emphasized that the proposed solution enables to effectively stop the movement of the mobile mass 2 and of the associated suspension elements 5 outside the plane xy, thus protecting the device from possible breakings, and at the same time reduces or even cancels out effects of electrostatic interactions with the stopper elements provided for this purpose, without affecting the electrical behavior of the device.

It is thus possible to obtain a z-axis microelectromechanical device that is perfectly ratiometric and insensitive to problems of electrostatic charge of the package. The stopper structure proposed proves mechanically robust, so preventing any risk of it breaking during impact with the mobile mass.

The embodiment described in FIG. 7 is particularly advantageous for eliminating the effects caused by a misalignment between the cap and the substrate occurring in the manufacturing stage, in particular in all the cases where the stopper elements 12, 14 have, due to this misalignment, a changed area of overlap with the mobile mass 2, and for this reason a resultant twisting moment on the mobile mass occurs. In particular, this configuration can be advantageously applied, with obvious modifications, to the fourth, fifth, and sixth embodiments of the present disclosure.

Figure 8:
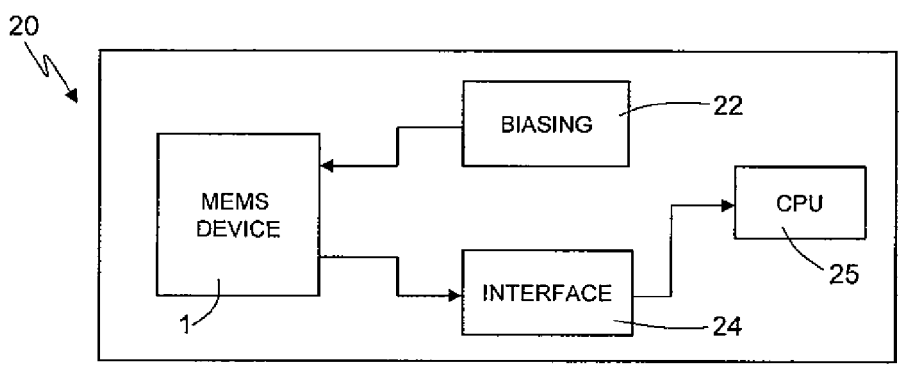
FIG. 8 shows a simplified block diagram of an electronic apparatus incorporating the microelectromechanical device according to the invention.

The device described is particularly advantageous for use in an electronic apparatus 20 (FIG. 8), of a portable type, for example, a cell phone, a PDA, a palmtop or portable computer, a digital audio player, a remote control, a video camera or photo camera, etc. having a microelectromechanical device 1 (of the type described previously); a biasing circuit 22, designed to supply electrical biasing quantities to the microelectromechanical device 1 (in a per se known manner which is thus not described in detail herein); an interface circuit 24, designed to interface with the microelectromechanical device 1 for reading one or more electrical quantities associated thereto (in a per se known manner which is thus not described in detail herein); and a microprocessor control unit 25, connected to the interface circuit 24 and designed to supervise general operation of the electronic apparatus 20.

Finally, it is clear that modifications and variations can be made to what is described and illustrated herein, without thereby departing from the scope of the present disclosure, as defined in the annexed claims.

In particular, different shapes and arrangements of the stopper elements can be adopted, provided that they reduce the resultant twisting moment of the mobile mass 2 due to the reciprocal electrostatic interaction. The mobile mass 2 can have a different conformation: for example, the suspension elements 5 could extend towards respective anchorages on the outside of the mobile mass 2; in this case the window 4 traversing the mobile mass centrally is not provided, and the mobile mass 2 comprises just one connecting portion 2c, set centrally between the larger and smaller portions 2a, 2b. The microelectromechanical device can also include a greater number of mobile masses, each provided with a corresponding stopper structure.

The stopper elements 12, 14 can have substantially straight walls, instead of inclined walls (as illustrated in the previous figures), in the case where they are obtained with a dry etch. Furthermore, the stopper elements could be made as elements distinct from the cap 10, and be coupled thereto in any known manner.

Finally, it is clear that the present disclosure can be applied advantageously in all z-axis microelectromechanical devices (with a mobile mass with a "tilting" and unbalanced movement), and in particular in sensor devices, such as accelerometers, microphones and gyroscopes.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A microelectromechanical device, comprising:
a substrate;
elastic suspension elements;
a mobile mass, suspended above the substrate via the elastic suspension elements and configured to be rotated about said elastic suspension elements;
a cover structure arranged above said mobile mass and having an internal surface facing said mobile mass; and
a stopper structure arranged at said internal surface of said cover structure and extending from the internal surface towards said mobile mass, the stopper structure being configured to stop a movement of said mobile mass away from said substrate along an axis (z) transverse to said substrate, said stopper structure having tapered sides that extend from the internal surface towards a lower surface of the stopper structure, the tapered sides being configured to partially overlap edges of said mobile mass and configured to reduce an effect of a reciprocal electrostatic interaction, the lower surface of the stopper structure does not overlap the edges of the mobile mass.

2. The device according to claim 1, wherein said stopper structure is configured to reduce a resultant twisting moment of said mobile mass about said elastic suspension elements due to said interaction, the mobile mass having a different electrical potential than the stopper structure.

3. The device according to claim 2, wherein said stopper structure is configured to cancel out the resultant twisting moment.

4. The device according to claim 2, wherein said elastic suspension elements are aligned with each other and define a rotation axis of said mobile mass, and said stopper structure is near said rotation axis.

5. The device according to claim 4, wherein said stopper structure is directly above and centered with respect to said rotation axis.

6. The device according to claim 4, wherein said mobile mass includes a window positioned internally, the elastic suspension elements are positioned in the window, and said stopper structure includes a first stopper element and a second stopper element positioned on opposite sides of said window and overlapping the edges of said mobile mass along said rotation axis.

7. The device according to claim 2, wherein said mobile mass is unbalanced with respect to a rotation axis defined by said elastic suspension elements, the mobile mass includes a larger portion and a smaller portion, the larger portion and the smaller portion are positioned on opposite sides of said rotation axis; the interaction with said stopper structure is configured to generate a first twisting moment of said larger portion and a second twisting moment of said smaller portion which are opposite with respect to said axis of rotation, and said stopper structure is configured to balance said first and second twisting moments.

8. The device according to claim 7, wherein said stopper structure includes a first tapered portion overlapping said larger portion and a second tapered portion overlapping said smaller portion of said mobile mass, the first and second tapered portions are positioned on opposite sides with respect to said rotation axis; said first and second portions of said stopper structure are both positioned at a distance from said rotation axis and having equal areas of overlap with said mobile mass.

9. The device according to claim 7, wherein said stopper structure includes a first stopper element and a second stopper element, which are equal in size with respect to one another and are set on opposite sides of, and at a same distance from, said rotation axis.

10. The device according to claim 7, wherein said stopper structure comprises a first stopper element and a second stopper element, overlapping the edges of said mobile mass with respect to said rotation axis for an entire extension of said edges; said first stopper element overlapping said smaller portion of said mobile mass and having an amount of overlap in a direction transverse to said rotation axis greater than a corresponding amount of overlap of said second stopper element with said larger portion.

11. The device according to claim 7, wherein said stopper structure comprises a first stopper element and a second stopper element, extending in a direction transverse to said rotation axis, the tapered sides overlapping the edges of said mobile mass, for an entire extension of said edges.

12. The device according to claim 11, wherein said first and second stopper elements have a first width at said smaller portion and a second width at said larger portion of said mobile mass, said first width being greater than said second width.

13. The apparatus according to claim 7, wherein said stopper structure includes a first portion overlapping said larger portion and a second portion overlapping said smaller portion of said mobile mass, the first and second portions are positioned on opposite sides with respect to said rotation axis; said first and second portions of said stopper structure are both positioned at a different distance from said rotation axis and have different areas of overlap with said mobile mass, said different areas of overlap being a function of a respective distance from said rotation axis.

14. The device according to claim 1, wherein said mobile mass extends mainly in a plane and is configured to rotate out of said plane about said elastic suspension elements; said stopper structure configured to limit a movement of said mobile mass in a direction transverse to said plane.

15. The device according claim 1, wherein said stopper structure and said cover structure are formed in a same wafer of material, and said stopper structure is a downward projecting portion of said cover structure that extends away from the internal surface of the cover structure towards said mobile mass.

16. An electronic apparatus, comprising:
a substrate;
first elastic suspension elements;
a microelectromechanical device suspended above the substrate by the first elastic suspension elements, the microelectromechanical device including:
second elastic suspension elements;
a mobile mass, suspended above the substrate by the second elastic suspension elements and configured to rotate about said second elastic suspension elements;
a cover structure arranged above said mobile mass and having an internal surface facing said mobile mass; and
a stopper structure extending from said internal surface of said cover structure towards said mobile mass and configured to stop a movement of said mobile mass away from said substrate along an axis transverse to said substrate, said stopper structure having tapered sides that meet at a lower surface that is spaced from the mobile mass, the lower surface being parallel to the internal surface of the cover structure.

17. The apparatus according to claim 16, wherein said stopper structure is configured to reduce a resultant twisting moment of said mobile mass about said elastic suspension elements due to a reciprocal electrostatic interaction, said interaction resulting from a different electrical potential of the mobile mass and the stopper structure.

18. The apparatus according to claim 16, wherein said stopper structure is configured to make substantially zero said resultant twisting moment.

19. The apparatus according to claim 16, wherein said elastic suspension elements are aligned with each other and define a rotation axis of said mobile mass, and said stopper structure is adjacent to said rotation axis.

20. The apparatus according to claim 16, wherein said stopper structure is directly above said rotation axis.

21. The apparatus according to claim 16, wherein said mobile mass includes a window in which said elastic suspension elements are positioned, and said stopper structure includes a first stopper element and a second stopper element positioned on opposite sides of said window and overlapping opposite sides of said mobile mass along said rotation axis.

22. The apparatus according to claim 16, wherein said mobile mass is unbalanced with respect to a rotation axis defined by said elastic suspension elements and includes a larger portion and a smaller portion, that are positioned on opposite sides of said rotation axis; the interaction with said stopper structure configured to generate a first twisting moment of said larger portion and a second twisting moment of said smaller portion, and said stopper structure configured to balance said first and second twisting moments.

23. The apparatus according to claim 16, wherein said stopper structure includes a first portion overlapping said larger portion and a second portion overlapping said smaller portion of said mobile mass, which are positioned on opposite sides with respect to said rotation axis; said first and second portions of said stopper structure positioned at a same distance from said rotation axis and have equal areas of overlap with said mobile mass.

24. The apparatus according to claim 16, wherein said stopper structure includes a first stopper element and a second stopper element set on opposite sides of, and at a same distance from, said rotation axis.

25. The apparatus according claim 16, wherein said stopper structure and said cover structure are formed in a same wafer of material, and said stopper structure includes a downward projecting portion of said cover structure that extends away from the internal surface of the cover structure towards said mobile mass.

26. The apparatus of claim 16, wherein the tapered side walls extend from the lower surface of the stopper to the internal surface of the cover structure and over edges of the mobile mass to extend over a portion of a top surface of the mobile mass.

* * * * *